United States Patent [19]

Crowley et al.

[11] 4,088,969
[45] May 9, 1978

[54] TAPPED SURFACE ACOUSTIC WAVE DELAY LINE

[75] Inventors: James D. Crowley; Joseph F. Weller, both of Oxon Hill, Md.; Thomas G. Giallorenzi, Springfield, Va.

[73] Assignee: The United States of America as represented by the Secretary of the Navy, Washington, D.C.

[21] Appl. No.: 788,874

[22] Filed: Apr. 19, 1977

[51] Int. Cl.² .................. H03H 9/30; H03F 3/04; H01L 45/02; H03F 3/55
[52] U.S. Cl. ................... 333/30 R; 310/313; 330/5.5; 333/70 T
[58] Field of Search ............... 333/30 R, 72, 71, 70 T; 330/5.5; 310/313; 331/107 A; 364/819, 821, 836, 860; 350/161 P, 161 S, 161 W

[56] References Cited

U.S. PATENT DOCUMENTS

| 3,684,970 | 8/1972 | Wang | 330/5.5 |
| 3,739,290 | 6/1973 | Marshall et al. | 330/5.5 |
| 3,821,667 | 6/1974 | Thomann | 333/30 R |

Primary Examiner—Alfred E. Smith
Assistant Examiner—Marvin Nussbaum
Attorney, Agent, or Firm—R.S. Sciascia; Philip Schneider; Michael C. Greenbaum

[57] ABSTRACT

A tapped surface acoustic wave (SAW) delay line with time-resolved outputs using piezoelectric leaky wave coupling and bulk wave amplification, and having low loss characteristics. A solid piezoelectric semiconductor is placed adjacent to a solid piezoelectric substrate. A pulsed rf input signal is applied to interdigital transducers (IDT) on the substrate. The applied signal launches a SAW in the substrate in a direction parallel to the interface between the substrate and the piezoelectric semiconductor solid. Upon reaching the interface, the SAW is piezoelectrically leaky-wave coupled across an air gap to a bulk acoustic wave in the piezoelectric semiconductor. Reflections of the bulk wave occur at both surfaces of the piezoelectric semiconductor, and piezoelectrically couples back across the air gap to excite a SAW on the piezoelectric substrate. The resultant rf output includes the normal delayed SAW pulse and additional delayed and time-resolved pulses. The amplitude of the bulk wave may be increased using bulk wave amplification.

12 Claims, 6 Drawing Figures

TAPPED SURFACE ACOUSTIC WAVE DELAY LINE

BACKGROUND OF THE INVENTION

The present invention relates generally to tapped delay lines and more specifically to those devices utilizing surface acoustic waves coupled from one piezoelectric substrate to a bulk wave in an adjacent piezoelectric semiconductor substrate by means of piezoelectric coupling across an air gap.

Previously, SAW delay lines could be tapped by the same means that one uses to generate and detect SAWs. These techniques have included interdigital transducers, and other variations which are reviewed in an article entitled "Surface Elastic Waves" by R. M. White, appearing in the Proceedings of the IEEE, Vol. 58, No. 8, August 1970. There are several disadvantages associated with these techniques; they can be lossy, require intimacy with the substrate (e.g. metal interdigital transducers), introduce reflections, and mass load. Also, the tapped energy will always have a delay time shorter than the normal delay between the input and output unless the tapped energy is transferred to another delay line requiring more electrical connections. Applicant's device provides a method for extracting energy from the SAW delay line, delaying it longer than the normal time, without introducing large insertion losses, and without requiring other electrical connections.

Another way of tapping a SAW delay line is piezoelectric leaky wave coupling across an air gap. Heretofore, this has only been used to couple surface waves from one surface to another surface; each surface being on a substrate of the same type of material.

Since identical materials have identical velocities of propagation, the coupled SAW has the same delay time as a SAW which traveled an equal path lenth on the original substrate. In this case, there is a single input and a single output. Because the original SAW is not preserved, this structure is not utilized as a tapped delay line but as a means of transferring SAW energy from one substrate to another. In the applicant's invention, piezoelectric leaky wave coupling across an air gap is utilized to construct a tapped delay line which preserves the original SAW and provides additional, multiple, delayed and timeresolved pulse.

A further method, disclosed by Wang in U.S. Pat. No. 3,684,970, utilizes a thin fluid layer between a piezoelectric crystal and a piezoelectric semiconductor place adjacent to each other. This form of coupling utilizes acoustical coupling obtained by means of the fluid layer being in contact with both surfaces to transfer the elastic wave from one surface to the other surface. The disadvantages of this technique are the mass loading of both surfaces which introduces loss, and the results in the initial surface wave pulse being strongly attenuated. Furthermore, the use of a liquid layer interface has disadvantages in fabrication, lifetime of the device, and reproducibility. Wang's device utilizes elastic coupling whereupon the vibrations of the particles in the substrate cause the particles in the liquid to vibrate transferring energy to the liquid, since both the liquid and the substrate are in contact with each other. The vibration of the particles in the liquid then causes the particles in the semiconductor substrate to vibrate since their surfaces are also in contact with each other. In other words, the liquid interface acts to combine the elastically the substrate and semiconductor material together. Applicant's device, on the other hand, does not combine the materials together to form a composite elastic structure. An $SiO_2$ spacer is used to prevent mass loading, but the spacer is located outside of the surface area where the surface acoustic wave propagates; this means that in the region where the surface wave propagates, the substrate material and the semiconductor material are not elastically coupled.

Applicant's device also utilizes a bulk wave amplifier in the piezoelectric semiconductor to amplify the bulk wave by the piezoelectric leaky wave coupling across the air gap. The semiconductor medium is electrically biased so that charge carriers drift with a velocity component parallel to the preferred propagating direction of bulk acoustic waves traveling in the semiconductor medium. Since the semiconductor material is piezoelectric, there is associated with the acoustic wave an electric field which can interact with the charge carriers in the semiconductor. In analogy to the electron-field interaction in a traveling wave tube, charge carriers radiate energy into the acoustic media if their velocity is greater than that of the acoustic wave. This, in turn, will cause the acoustic waves to grow in amplitude, and like the traveling wave tube, the growth is exponential versus distance. If the charge carriers travel slower than the acoustic wave, then the charge carriers absorb energy from the wave and the device acts as an attenuator. It should be noted that in the traveling wave tube, the charge carriers undergo no collisions, while in the ultrasonic amplifier, the mean free path of the charge carrier is short compared to the acoustic wavelength.

This type of amplification was first reported in a paper by A. R. Hutson, J. H. McFee, and D. L. White, entitled "Ultrasonic Amplification in CdS," appearing in Physical Review Letters, Vol. 7, September 1961, pp 237–239. There, 15 and 45 MHz acoustic waves were found to change in amplitude with voltage applied to the piezoelectric semiconductor, cadmium sulfide. When the electric field was such that the drift velocity of the electrons exceeded the velocity of sound, the acoustic waves were amplified as they traveled through the crystal. In this initial case of amplification, the acoustic waves were generated in the CdS by bulk wave transducers. In Wang's patent, mentioned previously, the bulk wave in the CdS was generated by elastically coupling a surface acoustic wave across a liquid layer to the piezoelectric media. In the applicant's device, the bulk wave generated in the CdS is obtained by piezoelectrically coupling a surface acoustic wave across an air gap to the CdS. In all cases, the amplification technique is the same, only the structures for coupling or generation of the bulk waves is different.

SUMMARY OF THE INVENTION

The present invention provides a layered structure consisting of two substrates of different material, adjacent to each other, and separated by an air gap of size smaller than the wavelength of the acoustic surface wave. The lower substrate is comprised of a piezoelectric material while the upper substrate is a piezoelectric semiconductor. Therefore, piezoelectric coupling exists between the layers through the air gap via their evanescent electric fields. The piezoelectric leaky wave coupling of surface acoustic waves on one substrate and bulk acoustic waves in the other substrate is utilized to construct a tapped delay line having multiple, time-resolved delayed outputs. A drift field may be applied to the piezoelectric semiconductor to amplify the delayed waves.

OBJECT OF THE INVENTION

An object of the present invention is to provide a tapped delay line with low insertion-loss characteristics.

Another object of the invention is to provide an inexpensive and easily fabricated acoustic wve delay line and amplifier with determinable delay characteristics.

BRIEF DESCRIPTION OF THE DRAWINGS

Other objects and many of the attendant advantages of the present invention will be readily apparent as the invention becomes better understood by references to the following detailed description with the appended claims, when considered in conjunction with the accompanying drawings, wherein:

BRIEF DESCRIPTION OF THE PREFERRED EMBODIMENT

Figure 1:
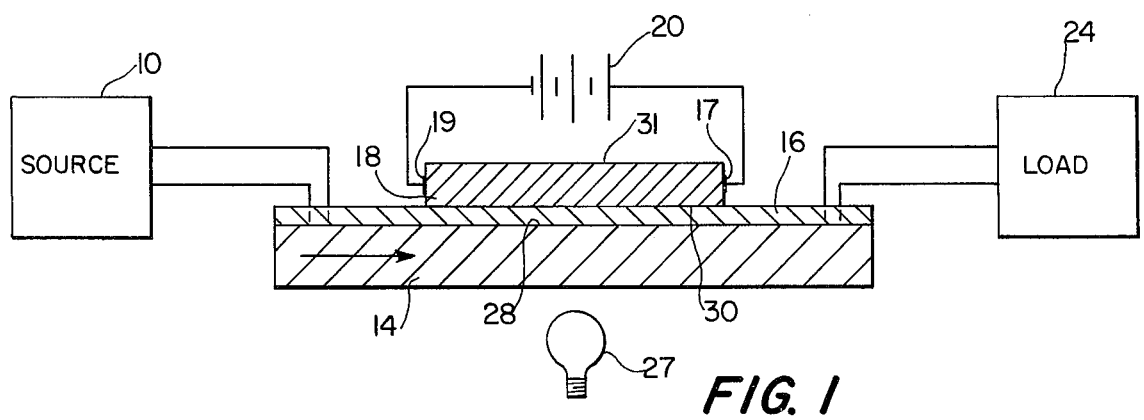
FIG. 1 is a schematic side view of one preferred embodiment of the present invention.
Figure 2:
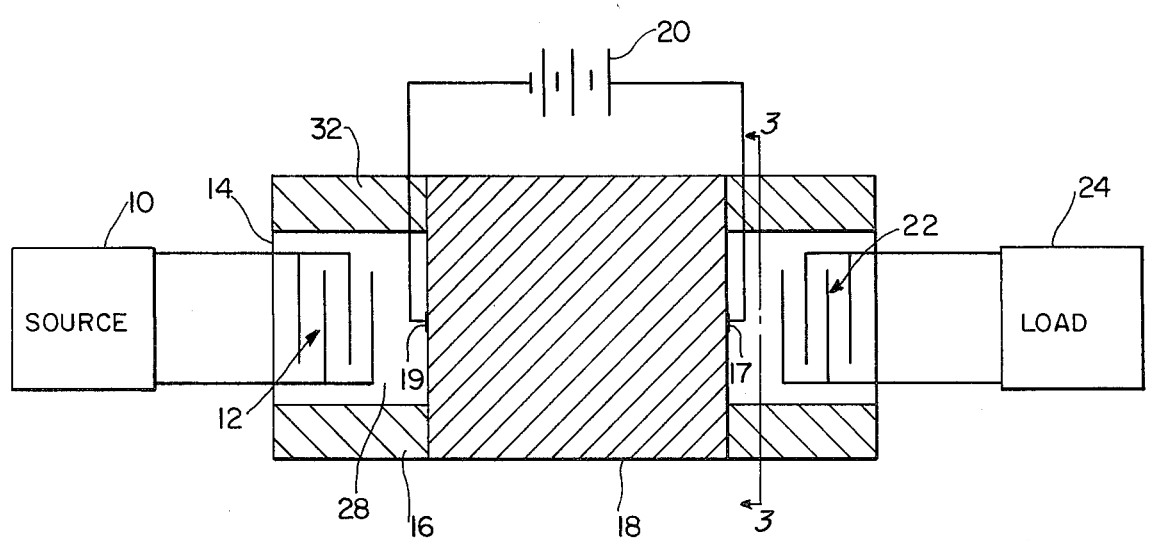
FIG. 2 is a plan view of the apparatus of FIG. 1.
Figure 3:
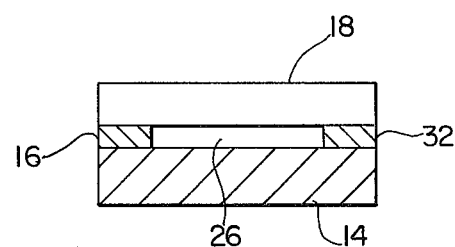
FIG. 3 is an end view of the apparatus of FIG. 1.

FIGS. 1 through 3 illustrate different views of a preferred acoustic-wave delay line and amplifier. These consist of an acoustically discontinuous, composite layered structure which includes a first layer 14, an intermediate air gap 26 created by placing spacers 16 and 32 between said first layer and second solid layer 18. This structure is acoustically discontinuous in the transverse direction.

The first layer or substrate 14 is piezoelectric material, such as lithium niobate ($LiNbO_3$), which may be Y-cut and Z-propagating so that waves propagating therein will have major components in a preferred direction. In the present embodiment, the preferred direction may be arbitrarily defined as the longitudinal axis of the substrate, and is indicated by the arrows in FIGS. 1 and 2. Other piezoelectric materials are also acceptable for the substrate.

A pair of interdigital surface-wave transducers (IDT), 12 and 22, may be deposited on an optically polished planar surface 28 of substrate 14. These two transducers may be positioned at opposite ends of the upper surface of first layer 14 to provide means for exciting and detecting surface waves. It is important to note that the particular type of transducer 12 and 22 may be varied, as desired, without departing from the scope of the invention. Any efficient means for generating a surface wave on the substrate may be used.

Transducer 12 may be connected to a source 10 of pulsed electrical energy. When an electrical signal is placed across adjacent digits of an interdigital transducer mounted on the surface of a piezoelectric material such as substrate 14, the difference in potential induces physical stresses and strains on such surface which effect propagation of a surface wave in the direction indicated by the arrow shown in FIG. 1. The velocity with which such a surface wave travels depends upon the elastic constants and the density of the material and, for lithium niobate, this velocity has been found to be approximately $3.5 \times 10^5$ cm/second. Transducer 22 converts a traveling surface wave to an electrical pulse by the reverse of the process which occurred in transducer 12 and is connected to an appropriate load 24.

The adjacent solid medium 18 is a piezoelectric semiconductor such as cadmium sulfide (CdS), however, it has been found that other types of piezoelectric material such as cadmium selenide (CdSe) or gallium arsenide (GaAs) may be also used to achieve suitable performance, in the manner described below.

Semiconductor 18 may be provided with an optically polished planar surface 30. This surface 30 is disposed adjacent and substantially parallel to upper surface 28 of substrate 14. In the preferred embodiment of the invention, substantially parallel surfaces 28 and 30 are separated by a narrow predetermined distance by two spacers, 16 and 32, placed lengthwise on upper surface 28, along the outside edges of substrate 14. This predetermined distance comprises air gap 26. Air gap 26 should be less than the acoustic wavelength to facilitate piezoelectric leaky-wave coupling, preferably not more than 1/10 of a wavelength.

In the preferred form of the invention, air gap 26 is created between planar surfaces 28 and 30. This air gap 26 is positioned in the path to be followed by a surface wave propagating on surface 28. Air gap 26 positioned as such insures that the original SAW is not attenuated by mass loading. Attenuation of a SAW due to mass loading occurs if the free surface along which the SAW is propagating is mechanically contacted with a liquid or a solid which suppresses the vibration of atoms at the surface of the substrate. Attenuation due to mass loading would occur if surface 30 of semiconductor 18 was allowed to mechanically contact surface 28 of substrate 14 in an area across which the SAW on surface 28 propagates. The existence of air gap 26 is essential to the efficient operation of this invention as described below.

To achieve the preferred parallelism between surfaces 28 and 30, two spacer rails, 16 and 32, are placed on upper surface 28 of substrate 14. Each spacer is located lengthwise at each side. Semiconductor 18 is placed directly upon these spacers, whose thickness predetermines the distance between substrate 14 and semiconductor 18. These spacers are preferably constructed of silicone dioxide ($SiO_2$) with a thickness typically of 0.67 um. However, any rigid dielectric material is suitable for use in place of $SiO_2$.

Amplification of acoustic waves in the piezoelectric semiconductor can be achieved by applying a voltage source 20 across semiconductor 18 in such a way that the net charge carrier flow in the semiconductor is in the direction of the acoustic wave which is to be amplified. The efficiency of the amplification process depends on the orientation of the c-axis of the piezoelectric semiconductor 18. Preferred orientation for maximum amplification can be selected for each type of acoustic wave which is being amplified. The semiconductor 18, typically a CdS wafer, is cut from a single crystal. Typical final dimensions are $l = 0.635$ cm, $w = 0.94$ cm and $t = 0.20$ cm. Typical direction angles of the c-axis of the CdS wafer with respect to the X, Y, and Z axis of substrate 14 and $\alpha = 138.2°$, $\beta = 49.8°$, and $\gamma = 80.3°$. Electrodes 17 and 19, which may be constructed of indium are evaporated on the ends of semiconductor 18 for the application of a drift field parallel to the longitudinal axis of substrate 14. Source 10 applies a pulsed rf signal input to IDT 12. This causes a SAW to be created on surface 28 of substrate 14. A drift field may be simultaneously applied to semiconductor 18. The SAW created by the pulsed rf input travels along the substrate. When the SAW arrives at the region where semiconductor 18 first overlaps substrate 14, it begins to piezoelectrically leaky-wave couple to semiconductor 18 creating a bulk wave in the semiconductor. $\theta_B$, the angle of propagation of this bulk wave with respect to the surface normal, is determined by the phase-matching condition ($\sin\theta_B = V_B/V_{SAW}$). The phase velocity of the bulk wave ($V_B$) is a function of the angle between its propagation vector and the c-axis of semiconductor 18 (see B. A. Auld, "Acoustic Fields and Waves in Solids I," Wiley, New York, 1973, Chapter 8). For the c-axis orientation stated above, the phase-matching condition is satisfied for a bulk wave propagation direction $\theta_B = 36°$ and a phase velocity $V_B = 2.05 \times 10^5$ cm/sec.

The bulk wave propagates to upper surface 31 of the semiconductor where it is reflected back towards the substrate. When it again reaches the semiconductor-substrate interface, it is partially reflected. The reflected component of the bulk wave again begins to propagate towards upper surface 31, while the remaining energy of the bulk wave excites a SAW on substrate 14. Since the two faces of semiconductor 18, 30 and 31, are substantially parallel, the bulk wave is propagating at the correct angle to satisfy phase matching conditions. Thus, the bulk wave piezoelectrically excites a SAW on substrate 14 by its evanescent electric fields. This SAW propagates along surface 28 to the output IDT 22. This SAW is delayed in time with respect to the original SAW.

The bulk waves generated in semiconductor 18 are piezoelectrically coupled to the evanescent fields of the substrate SAW. If air gap 26 is uniform, the coupling strength is the same for all points along the semiconductor-substrate interface. As a result, the SAW continuously leaks into semiconductor 18 as it propagates along surface 28 of substrate 14. Bulk waves are excited in semiconductor 18 at every point along the semiconductor-substrate interface as the SAW propagates along the surface 28. Because of its finite velocity of propagation the SAW arrives at successive points along the interface at slightly later times. Bulk waves are excited at each successive point along the interface, and so they are excited at successively delayed times corresponding to the propagation time of the SAW. Each bulk wave propagates to the upper surface 31 of the semiconductor where it is reflected back towards the surface 30. Upon reaching surface 30, a bulk wave is partially reflected but some of its energy is extracted in the excitation of a SAW on surface 28 of substrate 14 by piezoelectric leaky wave coupling. This SAW is delayed with respect to the original SAW.

The additional delay time equals the difference in (a) the transit time of the bulk wave from the point of excitation by the original SAW to the point of excitation of an SAW on the substrate by the bulk wave; and, (b) the transit time of the original SAW between these two points. The transit time of the bulk wave is greater than the transit time of the original SAW. This occurs because of the slower velocity and greater path length of the bulk wave, and results in the generation of an SAW on surface 28 of substrate 14 which is delayed relative to the original SAW.

The SAW's excited by bulk waves which are excited at different points along the semiconductor-substrate interface and which undergo only one reflection at the lower surface 30 will continue propagating, repeating the process of reflection at the upper surface 31, partial reflection at the lower surface 30 and excitation of an SAW on surface 28 of substrate 14, which is delayed with respect to the original SAW. The SAW's excited by bulk waves, which are excited at different points along the semiconductor-substrate interface and which undergo two reflections at the upper semiconductor surface 31, are delayed identical times with respect to the original SAW. Therefore, the SAW's from the different bulk waves cumulatively add forming one SAW pulse. Since the path length of bulk waves which make two reflections at the upper semiconductor surface 31 is twice as long as the path length of the bulk waves which undergo only one reflection, the time delay of the SAW cumulatively formed by bulk waves making two reflections is twice the time delay of the SAW cumulatively formed by bulk waves making only one reflection.

If the physical dimensions of the substrate and semiconductor are properly selected, additional delayed SAW's can be produced by bulk waves making multiple reflections at the upper surface 31 of the semiconductor. The relative time delay of these pulses will be multiples of the time delay of the SAW pulse which is due to the bulk waves which make only one reflection. The number of such bulk wave reflections is dependent upon the thickness and length of the semiconductor. The preferred embodiment, for purposes of illustration only, and not as a limitation, allows two reflections of the bulk wave at surface 31.

For a given rf pulse width, the thickness of the semiconductor can be selected so that the substrate SAW pulse and the bulk wave pulse are completely resolved in time. If the semiconductor is of sufficient length, the bulk wave undergoes successive reflections at the upper and lower surfaces of the semiconductor. Upon each reflection at the lower surface 30, part of the bulk wave energy is coupled to a SAW on surface 28 of the substrate. Therefore additional, equally spaced, delayed and timeresolved pulses are obtained.

The amplitude of the bulk wave may be increased by using bulk wave amplification in the semiconductor. An electric field is applied causing electrons to drift parallel to the direction of propagation of the SAW. When the component of the electron drift velocity in the direction of propagation of the bulk wave exceeds the bulk wave velocity, amplification occurs. The CdS semiconductor used to construct the bulk wave amplifier may have high resistivity. The gain of such an amplifier is strongly dependent on resistivity. Thus, a tungsten lamp 27 may be used to illuminate the semiconductor through the substrate, creating lower resistivity for optimum gain. Because the intrinsic optical absorption length of the semiconductor is small in comparison to the sample thickness, illumination throughout the volume of the CdS wafer is not uniform. A region of lower resistivity is produced near the semiconductor-substrate interface. The gain is low in regions of high resistivity and high in regions of low resistivity. Therefore, the gain of the bulk waves is a function of position along their paths. An electronic gain of 46 dB has easily been obtained by this CdS bulk-wave amplifier.

Figure 4:
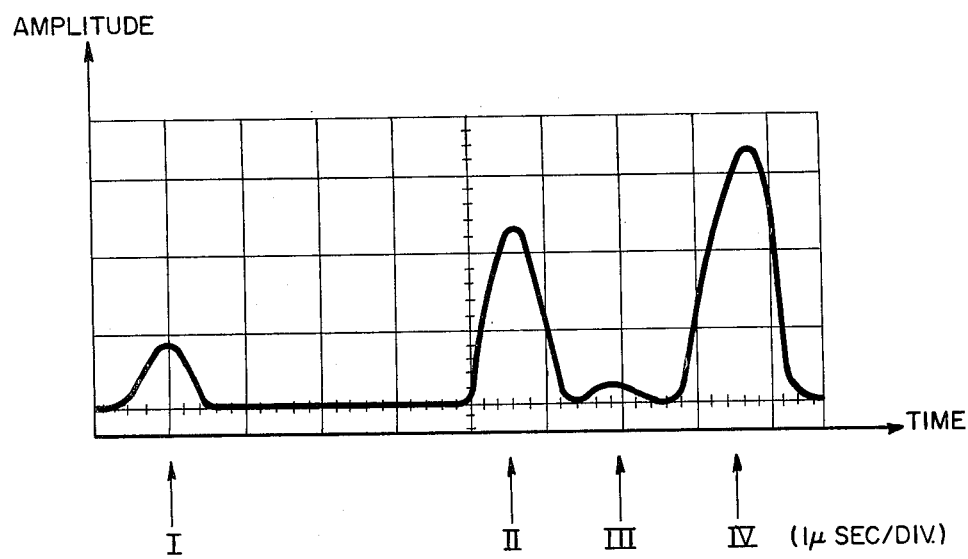
FIG. 4 is a graph of the output signals of the apparatus of FIG. 1.

For a pulsed 225 MHz rf input applied to the substrate, and a 3.9 kV/cm drift field applied to the semiconductor, the video output of the delay line is shown in FIG. 4. Pulse I is due to rf leakage from source 10; no attempt was made to minimize this leakage. Pulse II is the original substrate SAW output pulse, which has 4.6μsec delay in this case. The insertion loss of this delay line with untuned IDT's is 18 dB before coupling to the semiconductor. The insertion loss of the delay line increases only 1 dB due to the piezoelectric leaky wave coupling. Two additional pulses, III and IV and also present. Their amplitudes are dependent on the resistivity and the drift field of the semiconductor, while the amplitude of Pulse II is not. Pulse IV is 2.5 dB greater than the original SAW. Pulses III and IV are delayed 1.4 and 2.8μsec with respect to pulse II. Pulse III is due to bulk waves coupled to semiconductor 18 and making one reflection at the upper surface 31. Pulse IV is due to bulk waves which make two reflections at upper surface 31. Pulse IV is of greater amplitude than pulse III because of the greater period of time it is exposed to the drift field applied to the semiconductor. The semiconductor CdS wafer used to obtain the results illustrated in FIG. 4 is of sufficient length to allow multiple reflections of bulk waves in the CdS, that is, two reflections at each of the upper and lower faces of the semiconductor. This accounts for pulses III and IV, respectively.

Figure 5:
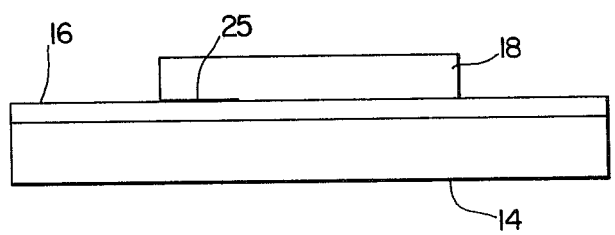
FIG. 5 is a schematic side view of a second preferred embodiment of the present invention.
Figure 6:
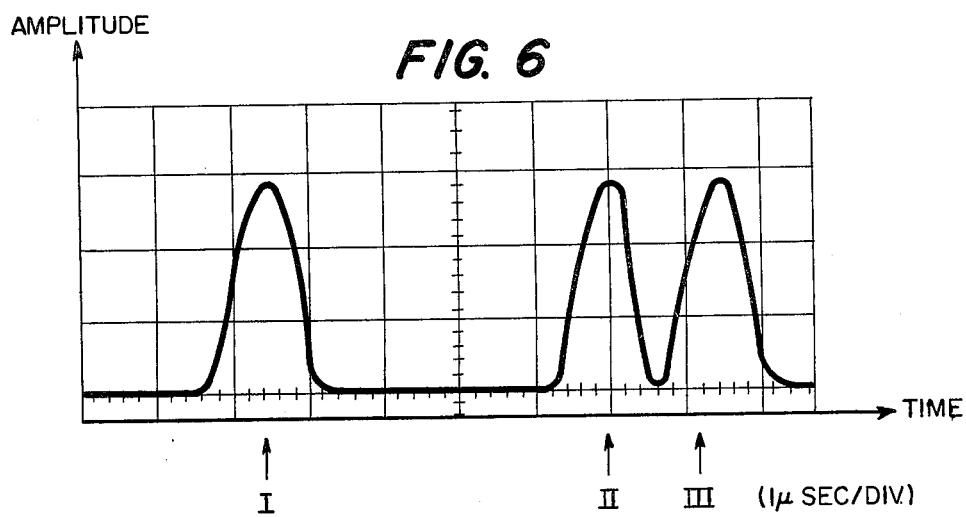
FIG. 6 is a graph of the output signals of the apparatus of FIG. 5.

It may be desirable in some applications, to limit the number of reflections of the bulk wave to one. This can be accomplished by decreasing the physical length of the CdS crystal. However, the same effect can be achieved with a thin metal film. Since the coupling is piezoelectric, selective coating of the CdS with a thin metal film produces uncoupled regions and reduces the length of the coupled region. FIG. 5 illustrates an embodiment of the present invention whereby approximately one-half of the lower face of the CdS is coated with a 3 mm wide 2000 A thick indium film 25. FIG. 6 illustrates the video output of such a delay line, utilizing the same input values described previously. Pulse IV is not observed. The metal film shorts the evanescent fields of the LiNbO$_3$ SAW and prevents coupling until the SAW reaches the uncoated portion of the CdS. The uncoated portion of the CdS is of sufficient length to allow one reflection at the upper surface 31 of the CdS but not two reflections. Therefore, only one additional delayed pulse (III) is expected.

It should also be noted that the bulk wave could be coupled at the upper surface of the semiconductor to another substrate similar to substrate 14. Thus a SAW could be excited by a bulk wave. Such an embodiment can be useful for some applications.

In general, the SAW created in the substrate is split and a portion of it time-delayed. Thus, two signals arrive at the output IDT separated by a predetermined period of time. Further, since the amplifier gain is dependent on the drift field, the invention may also act as a variable power divider. Amplifier gains as large as 46 dB have been obtained so it is possible to design a 1000:1 power splitter as well as a 3 dB splitter by simply varying the drift field. The power in each pulse would be separated in time as described above.

Some applications may require that only a portion of the SAW signal be used to process or be operated on without disturbing a reference signal. This can easily be accomplished by the present invention since there are two paths over which the acoustic wave propagates.

In other applications, it may be required that the original SAW be eliminated yet a single further delayed or multiple, delayed replicas of the original SAW be preserved. This can be easily accomplished by the present invention by interrupting the propagation path of the SAW on surface 28 in the region of overlap of the piezoelectric semiconductor 18 and the piezoelectric substrate 14. This interruption may take the form of a slot cut in substrate 14 or the actual separation of substrate 14 into two separate pieces with the semiconductor 18 bridging the gap between them. A discontinuity in substrate 18 will eliminate the original SAW but will not affect the bulk acoustic waves excited in the piezoelectric semiconductor 14.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A delay line comprising:
    a piezoelectric acoustically elastic substrate having a substantially planar surface with a first velocity of elastic wave propagation;
    a first electroacoustic transducer mounted on said surface for transforming electromagnetic energy into a surface acoustic wave and propagating said surface acoustic wave in a given direction along said surface;
    a second electroacoustic transducer mounted on said surface and spaced from said first transducer in said given direction, for receiving acoustic waves and transforming them into electromagnetic energy;
    a piezoelectric element having substantially planar and parallel, first and second opposed surfaces, the first surface being placed near the surface of said substrate but separated therefrom by an air gap which is less than the wavelength of said surface acoustic wave, said element being located between said transducers and having a second-velocity of bulk acoustic wave propagation which is less than said first velocity of surface acoustic wave propagation, any surface acoustic wave generated by said first transducer along the surface of said substrate exciting a bulk wave in said element by means of piezoelectric leaky-wave coupling, said bulk wave propagating within said element and being reflected from the second to the first surface where it piezoelectrically leaky-wave couples back to the substrate to excite a second surface acoustic wave delayed with respect to the first surface acoustic wave.

2. The delay line of claim 1, wherein said piezoelectric element is fabricated from piezoelectric semiconductor material.

3. The delay line of claim 1, further including spacer means placed between said element and substrate to form the air gap.

4. The delay line of claim 1, wherein said first electroacoustic transducer applies pulsed electromagnetic energy to the substrate.

5. The delay line of claim 1, wherein said piezoelectric substrate is cut in a predetermined direction to facilitate piezoelectric coupling and aid in obtaining phase-matching between said acoustic surface waves and said excited bulk waves in the piezoelectric element.

6. The delay line of claim 1, further including a thin metal coating on a predetermined portion of the lower surface of the piezoelectric element to short electric fields of acoustic surface waves generate on the substrate.

7. The delay line of claim 3, further including means for applying an electric field across the piezoelectric semiconductor causing current carriers in said piezoelectric element to flow substantially in said given direction at a velocity slightly greater than said second velocity so as to amplify the bulk waves travelling in said piezoelectric semiconductor.

8. The delay line of claim 7, wherein said first electroacoustic transducer applies pulsed electromagnetic energy to the substrate.

9. The delay line of claim 7, wherein said piezoelectric substrate is cut in a predetermined direction to facilitate piezoelectric coupling and aid in obtaining phase-matching between said acoustic surface waves and said excited bulk waves.

10. The delay line of claim 7, further including a thin metal coating on a predetermined portion of the lower surface of the piezoelectric element to short electric fields of acoustic surface saves generated on the substrate.

11. An acoustic delay line amplifier, comprising:
a piezoelectric substrate cut in a predetermined direction having an optically polished, substantially planar longitudinal upper surface;
means for generating surface acoustic waves on said surface; said waves propagating at a first velocity in a given direction;
a piezoelectric semiconductor element disposed substantially parallel and adjacent to said pieszoelectric substrate, separated therefrom by an air gap, said semiconductor element having a c-axis oriented in a predetermined direction to the planar surface of said substrate, and a second velocity of propagation for bulk waves which is less than said first velocity;
said semiconductor element being oriented such that bulk waves are excited by said surface acoustic waves in such a direction and at such a phase velocity as to obtain phasematching of said surface acoustic and bulk waves;
spacer means disposed between said substrate and said piezoelectric semiconductor element to separate them and form said air gap of predetermined, substantially uniform spacing which is less than the acoustic wavelength of said surface acoustic wave, such waves propagating along the planar surface of said substrate exciting bulk waves in said semiconductor element by means of piezoelectric leaky-wave coupling through said air gap, said bulk waves having a travelling electric field within said semiconductor element;
means for applying a pulsed electric field across the piezoelectric semiconductor element causing charge carriers in said piezoelectric element to flow substantially in said given direction at a velocity slightly greater than said second velocity to amplify the bulk waves travelling in said piezoelectric semiconductor; and
means for extracting surface acoustic waves from said substrate, separated from said means for generating said surface acoustic waves in the longitudinal direction.

12. The delay line amplifier of claim 11, further including a thin metal coating on a predetermined portion of the lower surface of the piezoelectric semiconductor element to short electric fields of surface acoustic waves generated on the substrate.

* * * * *